US006914463B2

(12) United States Patent
Henry

(10) Patent No.: US 6,914,463 B2
(45) Date of Patent: Jul. 5, 2005

(54) FREQUENCY OUTPUT GENERATION THROUGH ALTERNATING BETWEEN SELECTED FREQUENCIES

(75) Inventor: Manus P. Henry, Oxford (GB)

(73) Assignee: Invensys Systems, Inc., Foxboro, MA (US)

(*) Notice: Subject to any disclaimer, the term of this patent is extended or adjusted under 35 U.S.C. 154(b) by 0 days.

(21) Appl. No.: 10/671,431

(22) Filed: Sep. 26, 2003

(65) Prior Publication Data
US 2004/0130358 A1 Jul. 8, 2004

Related U.S. Application Data

(60) Provisional application No. 60/415,535, filed on Oct. 3, 2002.

(51) Int. Cl.$^7$ ................................................ H03L 7/06
(52) U.S. Cl. ....................................... 327/150; 327/175
(58) Field of Search ................................ 327/107, 150, 327/175, 176, 171, 172, 173, 174, 144, 142, 145

(56) References Cited

U.S. PATENT DOCUMENTS

| 4,633,183 | A |   | 12/1986 | Heatherington | ............. 327/107 |
| 5,222,111 | A | * | 6/1993 | Muramatsu | .................. 377/49 |
| 5,410,582 | A | * | 4/1995 | Sato | ............................ 377/51 |
| 5,781,459 | A |   | 7/1998 | Bienz | ......................... 327/175 |

* cited by examiner

*Primary Examiner*—Linh My Nguyen
(74) *Attorney, Agent, or Firm*—Fish & Richardson P.C.

(57) ABSTRACT

Techniques are described for producing a signal having a desired frequency. The desired frequency can be produced to a very high precision, even when the desired frequency is very high. The techniques, in one example, represent an intermediate, otherwise non-available frequency, by dithering between two exact frequencies. Then, over some reasonably short timescale, the desired frequency is provided to high precision. Such precise frequency output may be used for, for example, measurement transmission and other uses. The techniques can be implemented in low-cost hardware, and may provide a precision of, for example, $10^{-6}\%$ for many frequencies.

27 Claims, 5 Drawing Sheets

FREQUENCY OUTPUT GENERATION THROUGH ALTERNATING BETWEEN SELECTED FREQUENCIES

CROSS-REFERENCE TO RELATED APPLICATIONS

This application claims priority to U.S. Provisional Application No. 60/415,535, filed on Oct. 3, 2002, and titled FREQUENCY OUTPUT GENERATION FOR INSTRUMENTATION APPLICATIONS, which is incorporated by reference in its entirety.

TECHNICAL FIELD

This invention relates to frequency generators.

BACKGROUND

Conventional systems exist for producing signals that have a desired frequency. In some cases, such systems may produce signals, and, in particular, low-frequency signals, to a workable level of precision for a particular application. Generally speaking, however, higher frequencies may be more difficult to produce with a needed level of precision.

For example, variables such as an electrical current are sometimes measured at a remote location, and then mapped onto a corresponding frequency value for transmission to another location. In this case, or in other cases where such a frequency value corresponds to a fast-changing measurement variable, the frequency value actually produced may have a lower precision level than a precision of the technique used to measure the variable. As another example, it may be the case that circuits designed to produce highly-precise frequencies are relatively expensive and/or complicated to design and use.

SUMMARY

According to one general aspect, a first signal is output having a first frequency that is lower than a desired frequency, a second signal is output having a second frequency that is higher than the desired frequency, and outputting the first signal and the second signal is alternated over a pre-determined time to generate an output signal that is substantially at the desired frequency.

Implementations may include one or more of the following features. For example, in alternating between outputting the first signal and the second signal, a first half-cycle of the first signal may be generated, and a second half-cycle of the second signal may be generated in time series with the first half-cycle of the first signal.

Also, in alternating between outputting the first signal and the second signal, a first half-cycle of the first signal may be generated, generation of the first half-cycle of the first signal may be stopped, and a second half-cycle of the second signal may be generated. Also, in alternating between outputting the first signal and the second signal, half-cycles of the first signal and the second signal may be generated, during the pre-determined time, in a pre-determined ratio to one another.

Also, in alternating between outputting the first signal and the second signal, a target value may be calculated based on the desired frequency and a reference signal, a count value that is accumulated in a counter in accordance with the reference signal may be compared to the target value, and the first signal may be generated as long as the count value is less than the target value.

In this case, in calculating the target value, the target value may be calculated based on a maximum count value expressible by the counter. Also, in generating the first signal, it may be determined that the count value is greater than or equal to the target value, and outputting of the first signal may be switched to outputting of the second signal.

In the latter case, in comparing the count value, the count value may be increased by a pre-determined factor, based on the reference signal. Further, in determining that the count value is greater than or equal to the target value, it may be determined that the count value is greater than the target value, a remainder of the count value divided by the target value may be calculated, and the counter may be re-set to an initial count value corresponding to the remainder.

Also, in determining that the count value is greater than or equal to the target value, it may be determined that the count value is equal to the target value, and it may be further determined that a generation time during which the first signal and second signal have been produced is greater than or equal to the pre-determined time. In this case, in determining whether the generation time is greater than or equal to the pre-determined time, it may be determined that the generation time is equal to the pre-determined time, and the count value may be re-set to an initial count value of zero.

According to another general aspect, a system includes a reference clock operable to output a reference signal, a counter operable to increase a count value with reference to the reference signal, a comparison circuit operable to compare the count value with a target value and output a corresponding comparison signal, and an output circuit operable to alternately output a first signal having a first frequency and a second signal having a second frequency, based on the comparison signal, wherein the first signal and the second signal, being alternately output over a pre-determined time period, result in an output signal substantially having a desired frequency.

Implementations may include one or more of the following features. For example, the first frequency may be lower than the desired frequency and the second frequency may be higher than the desired frequency. The output circuit may output the first signal and the second signal in time series with one another and in a pre-determined ratio to one another.

The target value may be determined based on a maximum count value expressible by the counter. The output circuit may initially output the first signal when the comparison signal indicates that the count value is less than the target value. A timer may be included that is operable to determine whether the pre-determined time period has elapsed during outputting of the first signal and the second signal by the output circuit.

The counter may be operable to increase the count value by a pre-determined factor and in accordance with the reference signal, as long as the count value is less than the target value. The intermediate output circuit may switch from outputting the first signal to outputting the second signal when the comparison signal initially indicates that the count value is greater than or equal to the target value. In this case, the system may include a counter re-set circuit operable to receive information that the count value is greater than or equal to the target value, and re-set the counter to an initial count value corresponding to a remainder of the count value divided by the target value.

According to another general aspect, a system includes a measuring subsystem operable to measure a variable, a mapping subsystem operable to map the variable to a corresponding frequency, a frequency generator operable to generate a first frequency that is lower than the desired frequency and a second frequency that is higher than the desired frequency, and further operable to alternately output the first frequency and the second frequency to obtain an output signal having an output frequency substantially equal to the corresponding frequency, and a transmitter operable to transmit the output signal.

Implementations may include one or more of the following features. For example, the frequency generator may include a reference clock operable to output a reference signal, a counter operable to repetitively increase a count value contained therein by a pre-determined incremental amount, based on the reference signal, and an output circuit operable to output the first frequency while the count value is less than a pre-determined value, and to switch to outputting the second frequency once the count value is greater than or equal to the pre-determined value. In this case, the output circuit may be further operable to determine that the count value is greater than or equal to the target value, perform a division of the count value by the target value, and determine a remainder of the division, and re-set the counter to an initial count value equal to the remainder.

According to another general aspect, a method of generating an output signal having a desired frequency includes calculating a target value based on the desired frequency and a reference signal, comparing a first count value to the target value (where the first count value is progressively accumulated in a counter in accordance with the reference signal), outputting a first output value as long as the first count value is less than the target value, and determining that the first count value has become a current count value that is greater than or equal to the target value. The method also includes calculating a remainder of a division of the current count value by the target value, re-setting the counter at an initial count value that is based on the remainder, and outputting a second output value, whereby the output signal is obtained.

Implementations may include one or more of the following features. For example, a second count value may be counted from the initial count value, while outputting the second output value. It may be determined that the second count value is greater than or equal to the target value, and the first output value may be output.

In comparing the first count value to the target value, the first count value may be progressively accumulating according to a pre-determined increment. In re-setting the counter, the initial count value may be re-set to be equal to the remainder.

The details of one or more implementations are set forth in the accompanying drawings and the description below. Other features will be apparent from the description and drawings, and from the claims.

DETAILED DESCRIPTION

Figure 1:
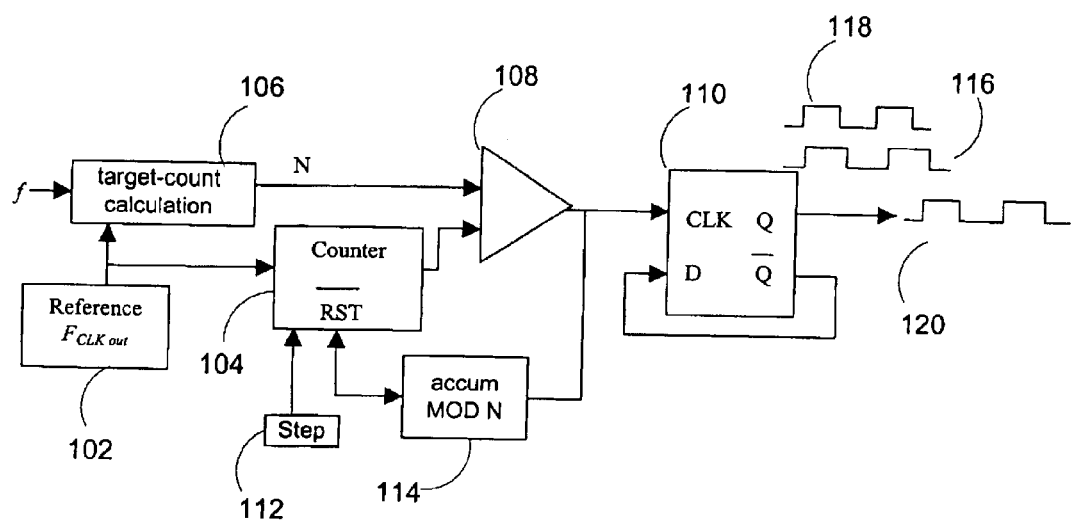
FIG. 1 is a block diagram of a frequency generation system.

FIG. 1 is a block diagram of a frequency generation system 100. In the frequency generation system 100, a reference clock 102 outputs a signal "$F_{CLKout}$" to a counter 104 and to a target-count calculation subsystem 106. $F_{CLKout}$ might vary from, for example, 100 kHz to 100 MHz or more.

The subsystem 106 inputs the signal $F_{CLKout}$ and a value for a frequency "f," which represents a desired frequency of a signal to be output by the system 100, and determines a value for a parameter "N," representing a number (target count) of clock cycles of the reference clock 102. The subsystem 106 also may utilize other factors in determining the value of the parameter N, and various examples of techniques by which the subsystem 106 calculates N are discussed in more detail below.

The counter 104 updates at every cycle of the reference clock 102, and a comparator 108 compares N to a current value "accum" accumulated by the counter 104. A flip-flop 110 outputs a "high" (or "low") value for the duration of a time when the value "accum" is less than the value N, and re-sets to a "low" (or "high") value when the value "accum" meets or exceeds the value N, as indicated by the comparator 108, whereupon the counter 104 also is re-set. In other words, the flip-flop alternates between high and low values at every half-cycle of a given frequency.

Therefore, one way to operate the system 100 is to set the counter 104 to count (from zero) once for every clock cycle of the reference clock 102, and to compare counter values "accum" to a target count N that represents half of a division of $F_{CLKout}$ by f (i.e., $N=F_{CLKout}/2f$, or the closest integer thereto). For example, if $F_{CLKout}$ were 10 MHz, and f is desired to be 10 kHz, then the target count N would be 500. Thus, every 500 clock cycles of the 10 MHz reference clock 102, the comparator 108 would go from low to high, and the flip-flop output would change its logical value. In this way, a full cycle of a signal having frequency f=10 kHz is output every 1,000 cycles of the reference clock 102.

According to this technique, the target count N is the only varying parameter, and, since it has an integer value, only certain discrete frequencies "f" can be generated. Specifically, the only frequencies f that can be generated can be described by Equation (1):

$$\text{exact\_f}_{out}(N) = \left(\frac{F_{CLKout}}{2N}\right) \quad (1)$$

In this technique, in cases where the value N is very high, a corresponding precision error is relatively small. For example, for a 40 MHz reference clock signal and a desired frequency f of 1 Hz, a target count N would be 20 million, so that frequency precision would be 1 part in 20 million. On the other hand, for a desired frequency f of 10 kHz, the target count N would be 2,000, so that the frequency precision would be 1 in 2,000. In the latter case, adjacent, obtainable frequencies would be 9,995 Hz or 10,005 Hz, so that precision error for a desired frequency f may be as high as 2.5 Hz.

According to another technique, a desired frequency f is obtained as an intermediate frequency between two generated frequencies. More specifically, the system 100 alternates, or "dithers," between the two generated frequencies. As a result, over the course of some pre-determined (minimum) amount of time, this dithering technique produces the intermediate frequency, which may be closer to the desired frequency than either of the two generated frequencies.

In one implementation of this technique, a parameter referred to as a "step" 112 is determined, and serves as a factor by which the counter 104 counts the value "accum."

For example, if step=10, then the counter 104 would count each clock cycle "t" by a factor of ten, i.e., the counter 104 counts accum=10, 20, 30 . . . for clock cycles t=1, 2, 3 . . . of the reference clock 102.

In this implementation, the target count N is determined (using techniques described below) such that the value "accum" of the counter 104 will meet or exceed the target count N at a half-cycle of one of the generated frequencies, and the flip-flop 110 will output a high (or low) signal accordingly. In cases where the value "accum" exceeds the target count N, the difference between the two values is used to re-set the counter 104.

In other words, rather than re-starting the counter 104 at zero, a value "accum MOD N" is used, where MOD represents a mathematical operation of Modulo arithmetic. More specifically, MOD represents a remainder of division of "accum" by N. For example, if accum=7 and N=5, accum MOD N=2. As another example, accum MOD N=0 for accum=20 and N=10. The value "accum MOD N" is calculated by a corresponding Modulo subsystem 114.

As a result, the counter 104 begins counting from a number larger than zero, and so, in some cases, will reach the value of the target count N sooner (in terms of numbers of clock cycles "t" of the reference clock 102). In these cases, the flip-flop 110 switches between high and low slightly sooner than it would if the counter 104 were counting from zero, and the signal output by the flip-flop 110 assumes the value of the second generated frequency.

In short, the Modulo subsystem 114, along with appropriate values for the parameters step and target count N, automatically causes the flip-flop 110 to alternate between a first signal 116 having a first frequency, and a second signal 118 having a second frequency, where the frequencies of the signals 116 and 118 are frequencies on either side of the desired frequency f. As a result, over the course of some pre-determined (minimum) amount of time, a signal 120 is output that is at or near the desired frequency f. Although shown in FIG. 1 as separate signals, it should be understood that the signals 116 and 118 are actually alternately output by the flip-flop 110 as the signal 120, as just described, and explained in more detail below.

An operation of this (and related) implementation of the system 100 are described in more detail below, with respect to FIGS. 2 and 3. Techniques for selecting appropriate values for, for example, the quantity step 112 and the target count N, are discussed below with respect to FIG. 4. FIG. 5 illustrates an example situation in which the system 100 might be used.

Figure 2:
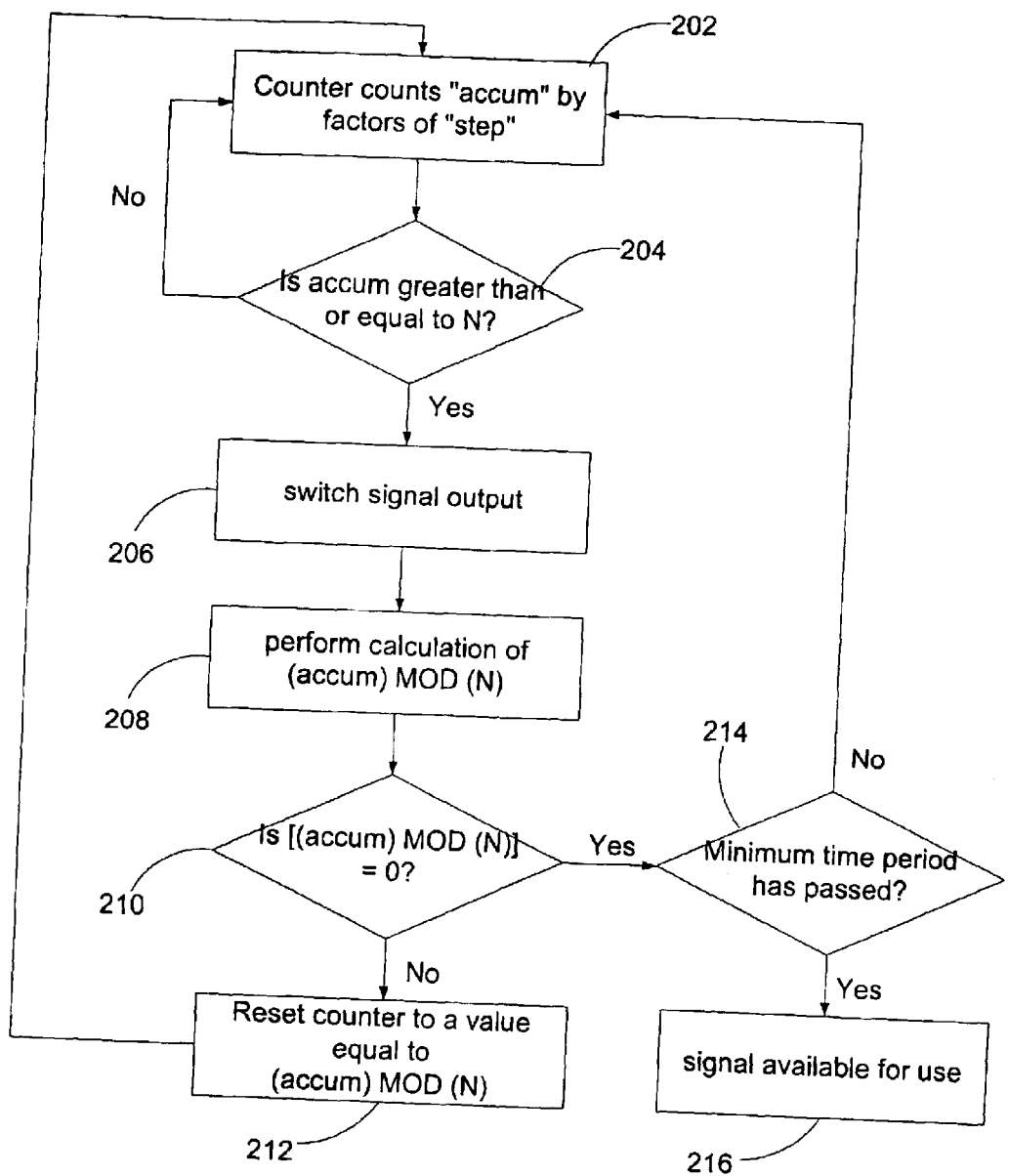
FIG. 2 is a flowchart illustrating an operation of the system of FIG. 1.

FIG. 2 is a flowchart 200 illustrating an operation of the system 100 of FIG. 1. In FIG. 2, the counter 104, initially set to zero, begins counting (i.e., increasing a value of the quantity accum) by a factor of step (202). As the quantity accum increases, the comparator 108 determines whether accum is greater than, or equal to, the target count N, where N has been selected with respect to the reference clock 102 to produce the signal 122 having the desired frequency f (204). If not, the counter 104 continues increasing accum (202). If the quantity accum is greater than the target count N, then the comparator 108 causes the flip-flop 110 to switch from high to low (or vice-versa) (206), thereby completing an outputting of a half-cycle of one of the signals 116 or 118.

Subsequently, the Modulo subsystem 114 calculates a quantity equal to "accum MOD N" (208). If this quantity is non-zero (210), then the quantity is used to re-set the counter 104 (212), whereupon the counter 104 counts from the quantity by the factor "step" (202).

If the quantity is zero (210), then it is determined whether the pre-determined minimum amount of time has passed (214). In some implementations, this determination may be made using a processor and/or memory (not shown), based on specific selected parameters of the system 100 and signals 116 and 118. In other implementations, some amount of time that is relatively short with respect to a process being measured, but that is long enough to satisfy the minimum time requirement for an expected range of frequencies 116 and 118, may be pre-selected.

If the minimum amount of time has not passed, then the counter 104 continues counting, from zero, by the factor "step." On the other hand, if the minimum time has passed (214), then the signal 120 is output by the system 100 (216). In another implementation, the signal 120 may be output for use even if the value of "accum MOD N" has not reached zero, as long as the minimum time has passed.

Figure 3:
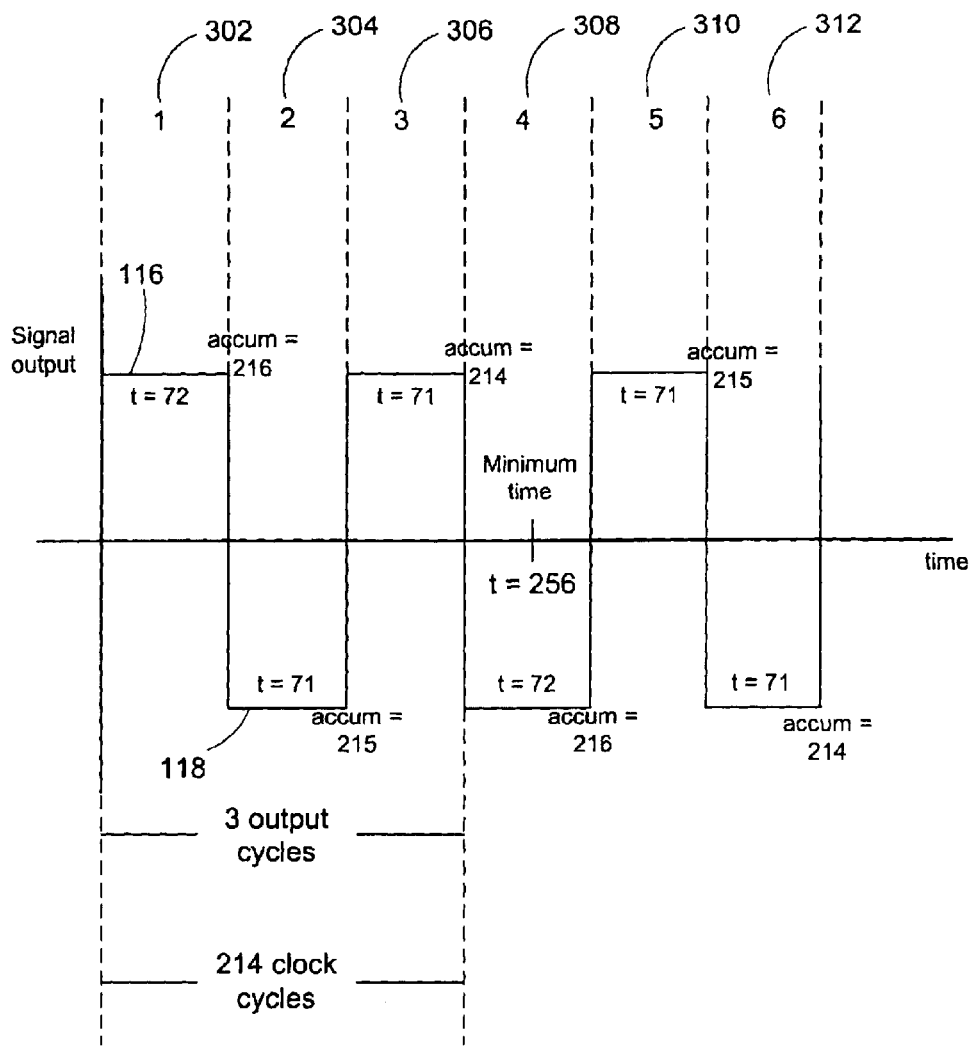
FIG. 3 is a timing diagram of an example of signals produced by the system of FIG. 1.

FIG. 3 is a timing diagram 300 of an example of the signals 116 and 118 produced by the system 100 of FIG. 1. Once produced by the flip-flop 110, and as already described above, the signals 116 and 118 form the signal 120 having a desired frequency f.

In FIG. 3, the reference clock 102 is assumed to output a frequency $F_{CLKout}$=1 kHz, and a desired frequency for the signal 120 is f=7 Hz. Also, a value of the target count N is equal to 214, and a value of the step is 3. In the example of FIG. 3, it should be understood that the above values are used below merely to clearly and easily illustrate an operation of the system 100, and are not intended to necessarily represent values that may be useful in any particular application of the system 100.

In FIG. 3, then, the counter 104 begins counting by a factor of three, i.e., accum=3, 6, 9, 12. . . . The counter 104 first exceeds the target count N=214 upon reaching a value of 216, at which time 72 cycles of the reference clock will have passed (since 216/72=3). At this point, the comparator 108 notifies the flip-flop 110 to invert from a high value to a low value, defining a first output half-cycle 302, and further instructs the Modulo subsystem 114 to calculate a value of "accum MOD N," which, in this case, is accum MOD N=216 MOD 214=2.

The counter 104 is then re-set to a value accum=2, and continues to count by a factor of step=3, i.e., accum=2, 5, 8, 11. Thus, in this case, the counter 104 first exceeds the target count N=214 upon reaching a value of 215, at which time only 71 cycles of the reference clock will have passed (since 215/71=3).

Again, the comparator 108 notifies the flip-flop 110 to invert (this time from a low value to a high value) defining a second output half-cycle 304, and further instructs the Modulo subsystem 114 to calculate a new value of "accum MOD N," which, in this case, is accum MOD N=215 MOD 214=1.

This process repeats, with the counter 104 counting from an initial value of 1, whereupon the counter 104 reaches a value of accum=N=214, so that accum MOD N=0. At this point, a third output half-cycle 306 has been defined, so that a total of three output half-cycles of the signals 116 and 118 have passed, and a total number of t=72+71+71=214 clock cycles of the reference clock 102 also have passed. Thus, it should be seen that the counter 104 is reset to zero every t=target count N clock cycles, and the number of output half-cycles in this time window is equal to the quantity step (here, step=3, and the output half-cycles are the half-cycles 302, 304, and 306). Thus, the output sequence just described repeats every target count N clock cycles, generating exactly step half-cycles.

This effect can be described more generally by stating that a value for accum at a $t^{th}$ clock tick of the reference clock 102 is $accum_t=[(t)(step)]MOD\ [N]$, so that, after N clock cycles of the reference clock 102, $accum_t=[(N)(step)]\ MOD\ [N]$, which, by definition, equals zero.

In FIG. 3, a frequency of the signal 118 (i.e., the signal corresponding to 72 clock cycles of the reference clock 102, including the first output half-cycle 302 and a fourth output half-cycle 308) is approximately 6.944 Hz. Meanwhile, a frequency of the signal 116 (i.e., the signal corresponding to 71 clock cycles of the reference clock 102, including the second and third output half-cycles 304 and 306, respectively, as well as a fifth output half-cycle 310 and a sixth output half-cycle 312) is approximately 7.042 Hz. However, over all six output half-cycles 302–312, a frequency f=7.009 Hz results, which is considerably closer to the desired f=7 Hz than the frequencies of the signals 116 and 118.

Also, it should be noted in FIG. 3 that there is a 1:2 ratio of output half-cycles for the signals 116 and 118 in each set of three output half-cycles. This ratio will vary from, for example, 1:1 to 1:many, depending on factors such as a value of parameters $F_{CLKout}$, step, N, desired frequency f, and other factors. Using the techniques described above, the ratio is automatically selected such that the dithering between the two signals 116 and 118 results in (or very close to) the desired frequency f.

Figure 4:
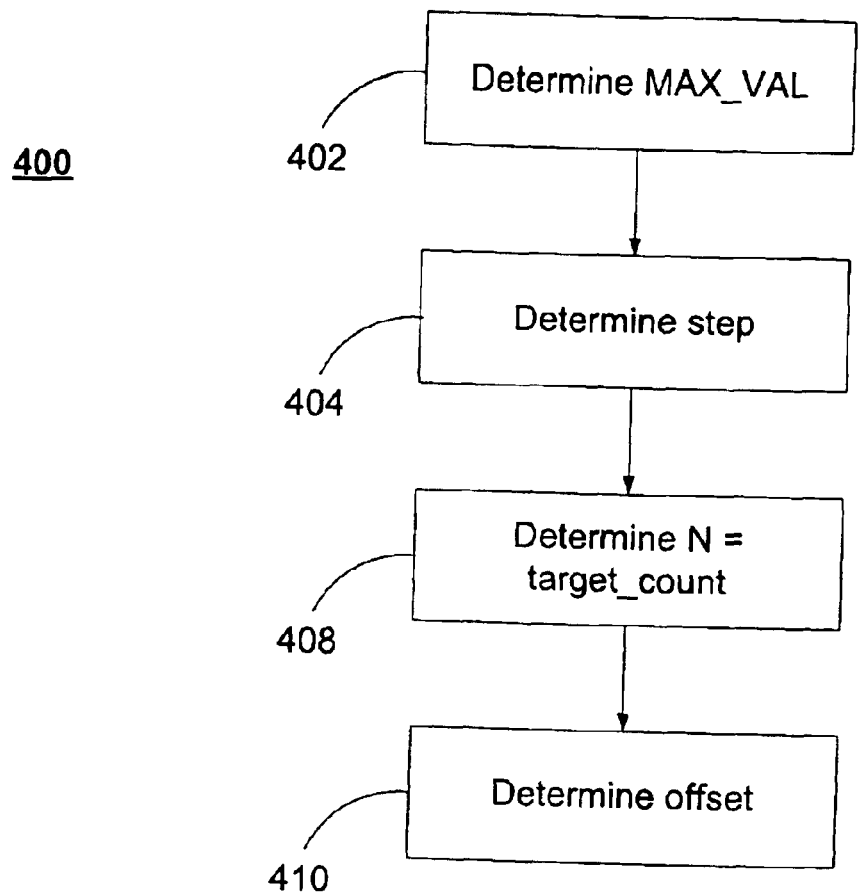
FIG. 4 is a flowchart illustrating techniques for determining parameters associated with an operation of the system of FIG. 1.
Figure 5:
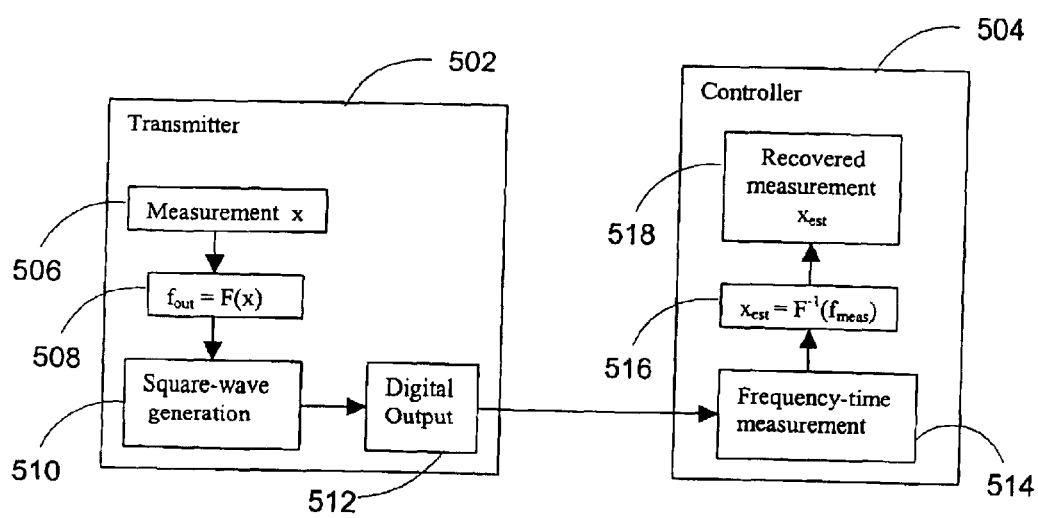
FIG. 5 is a block diagram of a system that may be used in applying a signal produced by the system of FIG. 1.

FIG. 4 is a flowchart 400 illustrating techniques for determining parameters associated with an operation of the system 100 of FIG. 1. In FIG. 4, a value MAX_VAL is selected that represents the largest power of two that can be represented by the counter 104 (402). Note that this is a function of the hardware associated with the counter 104, and can be changed by selecting new hardware for the counter 104. Thus, although larger values of MAX_VAL generally may lead to faster, more accurate production of the signal 122 (as seen below), obtaining these larger values may require the use of more expensive counter hardware.

Subsequently, a value for the parameter step is determined by calculating step=floor $[(MAX\_VAL)(2f)/(F_{CLKout})]$ (404). In other words, the parameter step is the closest integer value below the quantity set forth in the previous equation. Note that, in this calculation, the parameter MAX_VAL is serving as a rough approximation for the target count N.

In this example, the actual target count N is selected such that a ratio of step/N is as close as possible to $2f/F_{CLKout}$, or, put another way, N=round $[(step)(F_{CLKout}/2f)]$ (408). A parameter "offset" is then determined as a difference between MAX_VAL and target count N (410). Additionally, as referred to above, there exists a minimum time for ensuring a certain level of precision in frequency generation that may be defined as MAX_VAL by $F_{CLKout}$. That is, because MAX_VAL, by definition, dictates the maximum sequence length within the counter 104, the minimum time over which the theoretical frequency precision can be achieved is $MAX\_VAL/F_{CLKout}$ seconds.

Applying the techniques of FIG. 4 to the example of FIG. 3, and assuming that a small counter is used having a MAX_VAL of $2^8$=256, then a value of the parameter "step" becomes floor $[(MAX\_VAL)(2f)/(F_{CLKout})]$, or floor $[(256)(2)(7)/(1,000)]$=3. Then target count N becomes N=round $[(step)(F_{CLKout}/2f)]$, or round $[\{(3)(1000)\}/\{(2)(7)\}]$=214. Thus, offset=MAX_VAL−N=256−−214=42, and the minimum time is $MAX\_VAL/F_{CLKout}$=256/1,000=0.256 seconds. This amount of time corresponds to 256 clock cycles in FIG. 3, which is marked in FIG. 3 within the fourth output half-cycle 308.

As just described, the parameters step and target count N are selected such that target count N is as large as possible for the given hardware (i.e., as close as possible to MAX_VAL, while maintaining the desired ratio of step/N). This selection technique provides a simple algorithm for the selection of the relevant parameters, while providing simple expressions for the maximum frequency precision error, and ensuring this error is small.

More specifically, a frequency precision error is given by, for a positive error, Equation (2):

$$\frac{step}{target\_count+1} < \frac{2f}{F_{CLKout}} < \frac{step}{target\_count} \quad (2)$$

and, for a negative error, Equation (3):

$$\frac{step}{target\_count} < \frac{2f}{F_{CLKout}} < \frac{step}{target\_count+1} \quad (3)$$

The maximum error in f is inversely proportional to target count N. Therefore, in order to keep this error small, and in accordance with the techniques just described with respect to FIG. 4, target count N should be as large as possible.

For example, the frequency of the reference clock 102 may be 40 MHz, and the desired f may be approximately 10 kHz. In this example, if target count N can be as high as 40,000,000, a step value of 20,000 generates an exact frequency of 10 kHz at the output. Increasing target count N to 40,000,001 generates a sequence of pulses with a frequency over 40,000,001 clock cycles (i.e., 1 second) of 9,999.999,75 Hz. The available precision in f would thus be 1 part in 40 million, i.e. 0.00025 Hz.

Further, by using the techniques of FIG. 4, a counter value accum can be compared with MAX_VAL simply by testing a top bit of "accum," and the modulo operator MOD for MAX_VAL is equivalent to resetting the top bit of the accumulator.

It should be understood that the above techniques may implemented using hardware, software, or some combination. One example of an algorithm for use in an implementation using software is generically expressed in Code Section 1:

Code Section 1

```
accum₀ = 0;
while TRUE {
    while (accum_top_bit_not_set( )) accumₜ = accumₜ₋₁ + step;
    invert_pulse_output( );
    reset_accum_top_bit( );
    accumₜ = accumₜ + offset;
}
```

Further simplifications are possible if the top bit of the counter 104 can be used as the pulse output bit itself. In a real-time implementation, the value of the parameter offset may need augmenting by one or more times the parameter "step," in order to compensate for the clock cycles used to carry out the instructions for when the top bit of the counter 104 is set.

As referred to above, the parameter MAX_VAL limits an accuracy as well as a lower bound of the desired frequency f. Its value should be such that the quantity (MAX_VAL·2f)

is greater than or equal to $F_{CLKout}$ for the lowest desired frequency f, in order to ensure that the parameter "step," as calculated above, is greater than zero for all frequencies in the desired range. The maximum frequency f is limited by a value and accuracy of $F_{CLKout}$.

The techniques described above have been implemented in the programming language Handel-C (Celoxica 2002) on a Field Programmable Gate Array (FPGA), and tested for several frequencies in the range 2 Hz–20 KHz. The output frequency was measured using a digital frequency meter with 10-digit precision, a gate time of 2s, and 10 measurements for the statistics.

Simulation and experimental results for 10 kHz are presented in the following discussion. Small variations in the desired frequency f, of the order of 1 part in 10 million, were introduced to test the precision of the method. Table I shows the values of the optimal values for the parameters step, target count N, and offset for the desired frequency, using a 40 MHz clock and with MAX_VAL chosen to be $2^{24}$.

TABLE 1

| Required frequency | Optimal parameters | | | Theoretical | Simulated | Quantization error |
|---|---|---|---|---|---|---|
| f (Hz) | step | target_count | offset | $f_{out}$ (Hz) | $f_{out}$ (Hz) | ($\mu$Hz) |
| 9,999.997 | 8388 | 16776005 | 1211 | 9,999.997,020 | 9,999.997,020 | −20 |
| 9,999.998 | 8388 | 16776003 | 1213 | 9,999.998,212 | 9,999.998,212 | −212 |
| 9,999.999 | 8388 | 16776001 | 1214 | 9,999.998,808 | 9,999.998,808 | 192 |
| 10,000.000 | 8388 | 16775999 | 1216 | 10,000.000,000 | 10,000.000,000 | 0 |
| 10,000.001 | 8388 | 16775997 | 1218 | 10,000.001,192 | 10,000.001,192 | −192 |
| 10,000.002 | 8388 | 16775996 | 1219 | 10,000.001,788 | 10,000.001,789 | 212 |

The theoretical value for the frequency output are computed using the various relevant equations set forth above, and simulated values are determined over a time window with "step" number of output cycles.

Table I also shows the precision error due to the selection of integer values for step 15 and offset. It can be seen that this error is always less than half of the quantization step, which at 10 kHz and for the chosen value of MAX_VAL is ±0.0006 Hz.

Table 2 shows the results of actual experimental data.

TABLE 2

| | Experimental results | | | |
|---|---|---|---|---|
| Required frequency f (Hz) | Average $f_{out}$ (Hz) | Standard deviation ($\mu$Hz) | Frequency error ($\mu$Hz) | Frequency error (%) |
| 9,999.997 | 9,999.996,822,04 | 49.16 | 177.96 ± 98.32 | (1.8 ± 1.0) × $10^{-6}$ |
| 9,999.998 | 9,999.998,076,21 | 38.25 | −76.21 ± 76.50 | (7.6 ± 0.8) × $10^{-7}$ |
| 9,999.999 | 9,999.999,379,71 | 25.23 | −379.71 ± 50.46 | (−3.8 ± 0.5) × $10^{-6}$ |
| 10,000.000 | 10,000.000,203,8 | 21.21 | −203.8 ± 42.4 | (−2.0 ± 0.4) × $10^{-6}$ |
| 10,000.001 | 10,000.001,297,0 | 27.59 | −297.0 ± 55.2 | (−3.0 ± 0.6) × $10^{-6}$ |
| 10,000.002 | 10,000.002,430,7 | 34.65 | −430.7 ± 69.3 | (−4.3 ± 0.7) × $10^{-6}$ |

For the experimental tests, the instrument error (typically <±0.0720 Hz) and the FPGA crystal frequency error, mainly caused by slow temperature drift, were compensated for by adjusting the assumed value of $F_{CLKout}$ such that $f_{out}$ (i.e., the frequency of a signal corresponding to the signal 120 of FIG. 1) is as close as possible to f at 10 kHz, which in theory has a zero quantization error.

The results in Table 2 include mean and standard deviation of the real frequency output $f_{out}$, as well as the absolute and the relative error with respect to the desired frequency f, computed with 2σ confidence. For the given value of MAX_VAL, the theoretical precision is 6×$10^{-6}$% (i.e., $\Delta f/f = 1/MAX\_VAL = 0.00000006 = 6 \times 10^{-8} = 6 \times 10^{-6}\%$), which is achieved in the experimental data of Table 2.

FIG. 5 is a block diagram of a system 500 that might be used in applying a signal produced by the system 100 of FIG. 1. In FIG. 5, a transmitter 502 is used to transmit a measurement of a selected variable or parameter to a controller 504. Specifically, a measurement 506 of a variable "x" might be taken, where the variable "x" represents, for example, a current flowing through a monitored circuit. A mapping system 508 maps the measurement 506 of the variable "x" onto an equivalent frequency $f_{out}$. The frequency $f_{out}$ may be produced by the system 100 of FIG. 1, or a similar system, shown in FIG. 5 as a square-wave generator 510. An output signal is thus generated by the generator 510, and output by a transmitter 512 to the controller 504.

At the controller 504, the output signal is received at a frequency-time measurement subsystem 514. The frequency $f_{out}$, corresponding to the parameter "x," is thus estimated, and an inverse mapping system 516 applies the inverse of the mapping function applied by mapping system 508 to recover the measurement value "x." In this way, a quantity to be measured, such as a current or other circuit parameter (or many other types of data, such as a flow rate of a fluid), may be easily, quickly, and accurately transmitted from one location to another. Additionally, other types of transducers also may be implemented to use frequency output that is generated by the system 100, or similar systems, to communicate data.

In summary, frequency output for measurement transmission and other uses can be achieved using the implementations described above, or other implementations not explicitly described. These implementations can be easily implemented in low-cost hardware and may provide a precision of, for example, $10^{-6}$% for many frequencies.

The implementations generally represent an intermediate, otherwise non-available frequency, by dithering between two frequencies from among a number of available discrete frequencies. Over some reasonably short timescale, the desired frequency is produced to high precision. This precision, constant for all the relevant frequency range(s), depends only on the parameter MAX_VAL (as well as other factors related to an accuracy of the reference clock 102, such as a stability of the reference clock 102, which may be slightly altered by, for example, temperature fluctuations).

A number of implementations have been described. Nevertheless, it will be understood that various modifications may be made. Accordingly, other implementations are within the scope of the following claims.

What is claimed is:

1. A method comprising:
   outputting a first signal having a first frequency that is lower than a desired frequency;
   outputting a second signal having a second frequency that is higher than the desired frequency; and
   alternating between outputting the first signal and the second signal over a pre-determined time to generate an output signal that is substantially at the desired frequency with respect to the pre-determined time.

2. The method of claim 1 wherein alternating between outputting the first signal and the second signal comprises:
   generating a first half-cycle of the first signal; and
   generating a second half cycle of the second signal in time series with the first half-cycle of the first signal.

3. The method of claim 1 wherein alternating between outputting the first signal and the second signal comprises:
   generating a half-cycle of the first signal;
   stopping generation of the half-cycle of the first signal; and
   generating a half-cycle of the second signal.

4. The method of claim 1 wherein alternating between outputting the first signal and the second signal comprises generating half-cycles of the first signal and the second signal, during the pre-determined time, in a pre-determined ratio to one another.

5. The method of claim 1 wherein alternating between outputting the first signal and the second signal comprises:
   calculating a target value based on the desired frequency and a reference signal;
   comparing a count value that is accumulated in a counter in accordance with the reference signal to the target value; and
   generating the first signal as long as the count value is less than the target value.

6. The method of claim 5 wherein calculating the target value comprises calculating the target value based on a maximum count value expressible by the counter.

7. The method of claim 5 wherein generating the first signal comprises:
   determining that the count value is greater than or equal to the target value; and
   switching from outputting the first signal to outputting the second signal.

8. The method of claim 7 wherein comparing the count value comprises increasing the count value by a pre-determined factor, based on the reference signal.

9. The method of claim 8 wherein determining that the count value is greater than or equal to the target value comprises:
   determining that the count value is greater than the target value;
   calculating a remainder of the count value divided by the target value; and
   re-setting the counter to an initial count value corresponding to the remainder.

10. The method of claim 8 wherein determining that the count value is greater than or equal to the target value comprises:
    determining that the count value is equal to the target value; and
    determining whether a generation time during which the first signal and second signal have been produced is greater than or equal to the pre-determined time.

11. The method of claim 10 wherein determining whether the generation time is greater than or equal to the pre-determined time comprises:
    determining that the generation time is equal to the pre-determined time; and
    re-setting the count value to an initial count value of zero.

12. A system comprising:
    a reference clock operable to output a reference signal;
    a counter operable to increase a count value with reference to the reference signal;
    a comparison circuit operable to compare the count value with a target value and output a corresponding comparison signal; and
    an output circuit operable to alternately output a first signal having a first frequency and a second signal having a second frequency, based on the comparison signal,
    wherein the first signal and the second signal, being alternately output over a pre-determined time period, result in an output signal substantially having a desired frequency with respect to the pre-determined time period.

13. The system of claim 12 wherein the first frequency is lower than the desired frequency and the second frequency is higher than the desired frequency.

14. The system of claim 12 wherein the output circuit outputs the first signal and the second signal in time series with one another and in a pre-determined ratio to one another.

15. The system of claim 12 wherein the target value is determined based on a maximum count value expressible by the counter.

16. The system of claim 12 wherein the output circuit initially outputs the first signal when the comparison signal indicates that the count value is less than the target value.

17. The system of claim 12 wherein the counter is operable to increase the count value by a pre-determined factor and in accordance with the reference signal, as long as the count value is less than the target value.

18. The system of claim 17 wherein the intermediate output circuit switches from outputting the first signal to outputting the second signal when the comparison signal initially indicates that the count value is greater than or equal to the target value.

19. The system of claim 18 further comprising a counter re-set circuit operable to receive information that the count value is greater than or equal to the target value, and re-set the counter to an initial count value corresponding to a remainder of the count value divided by the target value.

20. The system of claim 12 comprising a timer operable to determine whether the pre-determined time period has elapsed during outputting of the first signal and the second signal by the output circuit.

21. A system comprising:

a measuring subsystem operable to measure a variable having an associated frequency;

a mapping subsystem operable to map the variable to the associated frequency;

a frequency generator operable to generate a first frequency that is lower than a desired frequency and a second frequency that is higher than the desired frequency, and further operable to alternately output the first frequency and the second frequency over a pre-determined period of time to obtain an output signal having an output frequency substantially equal to the associated frequency with respect to the pre-determined period of time; and a transmitter operable to transmit the output signal.

22. The system of claim 21 wherein the frequency generator comprises:

a reference clock operable to output a reference signal;

a counter operable to repetitively increase a count value contained therein by a pre-determined incremental amount, based on the reference signal; and an output circuit operable to output the first frequency while the count value is less than a pre-determined value, and to switch to outputting the second frequency once the count value is greater than or equal to the pre-determined value.

23. The system of claim 22 wherein the output circuit is further operable to:

determine that the count value is greater than or equal to the target value;

perform a division of the count value by the target value, and determine a remainder of the division; and re-set the counter to an initial count value equal to the remainder.

24. A method of generating an output signal having a desired frequency, the method comprising:

calculating a target value based on the desired frequency and a reference signal;

comparing a first count value to the target value, where the first count value is progressively accumulated in a counter in accordance with the reference signal;

outputting a first output value as long as the first count value is less than the target value;

determining that the first count value has become a current count value that is greater than or equal to the target value;

calculating a remainder of a division of the current count value by the target value;

re-setting the counter at an initial count value that is based on the remainder; and outputting a second output value, whereby the output signal is obtained.

25. The method of claim 24 further comprising:

counting a second count value from the initial count value, while outputting the second output value;

determining that the second count value is greater than or equal to the target value; and outputting the first output value.

26. The method of claim 24 wherein comparing the first count value to the target value comprises progressively accumulating the first count value according to a pre-determined increment.

27. The method of claim 24 wherein re-setting the counter comprises re-setting the initial count value to be equal to the remainder.

* * * * *